(12) United States Patent
Chazan et al.

(10) Patent No.: US 6,262,579 B1
(45) Date of Patent: Jul. 17, 2001

(54) METHOD AND STRUCTURE FOR DETECTING OPEN VIAS IN HIGH DENSITY INTERCONNECT SUBSTRATES

(75) Inventors: David J. Chazan, Palo Alto; James L. Lykins, San Jose, both of CA (US)

(73) Assignee: Kulicke & Soffa Holdings, Inc., Willow Grove, PA (US)

( * ) Notice: Subject to any disclaimer, the term of this patent is extended or adjusted under 35 U.S.C. 154(b) by 0 days.

(21) Appl. No.: 09/191,594

(22) Filed: Nov. 13, 1998

(51) Int. Cl.[7] .......................... H01H 31/02; G01R 31/26
(52) U.S. Cl. ............................................. 324/537; 324/765
(58) Field of Search .................................. 324/537, 538, 324/539, 765, 756, 761; 430/30, 112

(56) References Cited

U.S. PATENT DOCUMENTS

| | | |
|---|---|---|
| 4,245,189 | 1/1981 | Wahl et al. .......................... 324/65 P |
| 4,675,600 | 6/1987 | Gergin ................................ 324/158 P |
| 4,835,465 | 5/1989 | Gergin ................................ 321/158 F |
| 4,947,112 | 8/1990 | Gaston et al. ...................... 324/158 F |
| 5,032,233 | 7/1991 | Yu et al. ............................ 204/192.28 |
| 5,278,012 | 1/1994 | Yamanaka et al. ..................... 430/30 |
| 5,425,649 | 6/1995 | Reymond ............................... 439/189 |
| 5,699,613 | 12/1997 | Chong et al. ........................... 29/852 |
| 5,753,976 | 5/1998 | Harvey ................................. 257/774 |
| 5,891,606 | * 4/1999 | Brown ................................. 430/312 |

* cited by examiner

Primary Examiner—Safet Metjahic
Assistant Examiner—J Kerveros
(74) Attorney, Agent, or Firm—Townsend and Townsend and Crew LLP

(57) ABSTRACT

A method for testing for open circuits on a common circuit base having pads for making electrical contact to the common circuit base on both the top and bottom of the circuit base. The common circuit base includes a thin film metal interconnect structure formed on its upper surface and the thin film interconnect structure including an upper dielectric layer deposited over a thin film metalization layer that has contact openings etched through the dielectric layer at selected locations for the formation of contact pads. The method includes the steps of (1) forming a seed layer over the upper dielectric layer and over the contact openings; (2) forming a photoresist layer over the seed layer and patterning the photoresist layer to expose selected portions of the seed layer such that the selected portions correspond generally to the contact openings; (3) plating a conductive layer over the patterned seed layer to form plated contact pads that are electrically connected to an underlying thin film metalization layer; and (4) inspecting the plated conductive layer for open circuits prior to performing subsequent process steps and/or tests. In different embodiments, such subsequent process steps and/or tests include: stripping the photoresist in areas where the contact pads are not formed to expose the seed layer underlying the photoresist; removing the exposed seed layer and performing an electrical test on the common circuit base to determine if any short circuits exist in the interconnect structure.

27 Claims, 6 Drawing Sheets

METHOD AND STRUCTURE FOR DETECTING OPEN VIAS IN HIGH DENSITY INTERCONNECT SUBSTRATES

BACKGROUND OF THE INVENTION

The present invention relates to the use of thin film deposition technology to create high density interconnects on a conventional printed wiring board substrate. More specifically, the present invention pertains to an improved method for testing for open circuits between high density connections in the overlying deposited thin film layers and low density connections that are either internal to the substrate or on the bottom of the substrate. The method of the present invention can be used with or without conventional build-up layers and initial conventional build-up layers and is useful for high density integrated circuit packaging of single chip, multi-chip, and support components such as resistors and capacitors. The method of the present invention is also useful for creating interconnections on high density daughter boards that carry packaged devices.

The semiconductor industry continues to produce integrated circuits of increasing complexity and increasing density. The increased complexity of some of these integrated circuits has in turn resulted in an increased number of input/output pads on the circuit chips. At the same time, the increased density of the chips has driven the input/output pad pitch downward. The combination of these two trends has been a significant increase in the connector pin wiring density needed to connect the chips to packages that interface with the outside world and interconnect the chips to other integrated circuit devices.

A number of different technologies have been developed to interconnect one or more integrated circuits and related components. One such technology is based on traditional printed wiring board (PWB) technology that found wide use during the period in which integrated circuits were packaged in surface mount devices like quad flat packs (QFPs). When used to interconnect multiple integrated circuits this PWB technology is often referred to as MCM-L or laminate MCM technology. PWB technology typically uses copper and insulating dielectric material sub-laminates as building blocks to create the required interconnect structures. The process of forming a copper conductive pattern on the sub-laminate in PWB technology typically includes forming a dry film of photo resist over the copper layer, patterning and developing the photo resist to from an appropriate mask and selectively etching away the unwanted copper thereby leaving the desired patterned conductive layer.

Substrates used in PWB technology can be manufactured in large area panels providing efficiencies that lower the costs of production. Interconnect solutions using this technology generally have relatively good performance characteristics because of the copper and low dielectric constant (e.g. less than or equal to 4.0) employed. The printed wiring board industry, however, has not kept pace with the advances in semiconductor manufacturing in terms of pad density and pad count. As a result, there is a capability gap between semiconductor manufacturers and interconnect printed wiring board manufactures.

In some applications, two or more pieces of laminate are laminated together to form a final structure. Interconnection between laminated layers can be provided by through hole mechanical drilling, followed by plating. The drilling process is relatively slow and expensive and can require a large amount of board space. As the number of interconnect pads increases, an increased number of signal layers is often used to form the interconnect structure. Because of these limitations, the conventional printed wiring board technology needs to go to a large number of metal layers (e.g. greater than eight layers) for some of the applications in high density integrated circuit packaging and daughter board fabrication. Utilizing a large number of layers in this context generally increases cost and decreases electrical performance. Also, the pad size limits the wiring density on any given layer with this technology. Thus, PWB technology, while useful for some applications, is not capable of providing the connection density required in other applications.

To improve the interconnect density of PWB technology, an advanced printed wiring board technology approach called build-up multi-layer has been developed. In this technology a traditional printed wiring board core is the starting point. Standard drilling and plating techniques are used to form plated through holes in the core. From the basic core this build-up approach has many variations. Typically a dielectric layer approximately 50 microns thick is laminated to both the top and bottom major surfaces of the conventionally fabricated printed wiring board substrate. Vias are made in the build-up layer by laser ablation, photo mask/plasma etch, or other known methods. An electroless seeding step is then done prior to a panel plating step that metalizes both the upper and lower surfaces. Subsequent masking and wet etching steps then define a desired conductive pattern over the laminated dielectric layers.

This technology offers a large improvement in terms of density over standard PWB technology without build-up layers; however, such build-up boards require multiple layers in order to meet the developing high density packaging and daughter board requirements. Thus this technology still has limitations.

Another conventional approach used to package high density interconnect applications uses cofired ceramic substrates and is referred to generally as multilayer ceramic or MLC technology or as MCM-C, cofired ceramic MCM and thick film MCM technology in the multichip module context. Basically, MLC technology involves rolling a ceramic mix into sheets, drying the sheets, punching vias, screening the rolled sheets with a metal paste representing the trace pattern on the surface of the ceramic, stacking and laminating all the layers together, then cofiring at a high temperature (e.g. greater than 850° C.) to achieve the desired interconnections.

MLC construction has found extensive use in high density and high reliability products where the robustness of the high density interconnect package outweighs the cost considerations. The ability to create a hermetic seal in the ceramic improves the ability to withstand environments not tolerable to conventional printed wiring board technology. While this technology is capable of high density packaging applications (e.g. greater than 1000 pads), it is also very costly. Additionally, performance characteristics, such as signal propagation time, are impacted due to the relatively high dielectric constant (e.g. between 5.0 and 9.0) of the ceramic material. MLC technology provides higher connection density than PWB technology, but is not capable of providing the connection density required for some of today's high density interconnect applications.

A third approach which the high density interconnect and packaging industry has moved toward to address these high density interconnect applications uses thin film deposition technology and is sometimes referred to as deposited on laminate or DONL technology in a broad sense and as MCM-D or MCM deposition technology in a multichip module context. In some applications, such DONL technology includes forming and patterning thin film conductive traces over large substrates such as the laminated printed wiring boards discussed above. Such large substrates may have a surface area of 40 centimeters by 40 centimeters or more, thereby providing efficiencies that lower the costs of production.

DONL technology utilizes a combination of low cost printed wiring board structures, with or without the use of the build-up multi-layers on the printed wiring board, as a starting point to meet the high density and low cost interconnect requirements. This combination of existing conventional high volume printed wiring board technology and advanced thin film deposition technology represents a significant economic advantage and density improvement as compared to the previously discussed PWB and MLC technologies.

One significant feature of DONL technology is that it creates a high interconnect density substrate using thin film processes on only one side of the printed wiring board. The high density interconnects are formed by depositing alternating conducting and insulating thin film layers. The total thickness of several of these deposited layers is less than the thickness of a single traditional build-up layer. This eliminates the need for balancing the build-up layers on both top and bottom to prevent warpage of the substrate.

The DONL process involves first laying down a layer of an insulating dielectric on the top surface of a printed wiring board substrate, depositing a conductive material over the dielectric layer, creating a circuit pattern in the conductive material, then depositing the next insulating and conductive layers. The various layers so created are connected through vias constructed using a variety of known techniques such as wet chemical etch, photo expose and develop or laser ablation. In this way a three dimensional deposited laminated structure is achieved enabling high density interconnect patterns to be fabricated in small physical areas.

Despite the definite advantages of DONL technology, there are potential problems that may result in failure modes and performance limitations if the overlying deposited thin film layers and the underlying printed wiring substrate are not properly fabricated. One such problem encountered in fabrication is the formation of non-continuities between the high density connections in the top pad layer of the deposited thin film layers and the low density connections either internal to the substrate or on the bottom of the substrate.

Non-continuities, also known as open circuits, have multiple causes including cracking and breaking of the conductors from thermal stress, incomplete metal plating of the through holes, point defects and/or over developing or over etching of the conductive layers, or open interlayer vias. Irrespective of the source of the open circuit, the substrate cannot be used when this type of failure exists. Thus prior to placing and connecting components on the substrate a test is done to verify that all electrical connections to the substrate have been properly made.

One conventional method of testing the continuity of the substrate involves contact testing using automated or semi-automated test equipment. These devices rely on making physical contact with each of the top and bottom surface connection points, applying a current, usually under the control of a computer or automated tester, and displaying or logging the results for human analysis. Many contemporary testers provide a simple pass/fail indication.

The major types of contact testing currently employed include bed-of-nails testing combined with planar probe testing or a flying head tester. In a bed-of-nails tester the substrate is placed in a fixture and spring loaded probes, or nails, are positioned in physical contact with each net to be tested. The spring force must be carefully controlled in order to insure that no damage is done to the conductor being tested. It is also important to insure that the nails make and break contact without sliding laterally across the metal nets since such a motion may cause damage such as shorts and opens. In a typical installation, when the nails are all in place the computer will run its program and either display or log the results, or both. A human operator then interprets the results and takes appropriate action. Another approach is a combination of both to speed up the process.

In planar probe testing, the substrate is again mounted in a fixture but instead of nails a series of relatively delicate probes, which have been planarized to make contact at exactly the same time, are placed on the surface of the substrate. This method uses less tactile force and has a finer probe contact pitch than bed-of-nails testing. Since the probes are rather delicate, however, they can be damaged by repeated contact with the surface of the substrate or by lateral motion during make/break sequences. Replacing and re-planarizing the probes is a time consuming and costly process.

Testing the continuity of substrates with thin film layers presents additional challenges to conventional test methods due to both the fine pitch of the connections and the delicate nature of the layers. With metalization and dielectric layers often less than 10 microns thick, the thin-film interconnect structure can be easily damaged by impact or sheer stresses generated by nails and probes. This delicate characteristic of the thin film layers increases the cost of the equipment, the set-up time, and the test time needed. All of these increase the cost and slow production.

Either of the contact test methods suffers from a number of drawbacks. First, the equipment required is itself costly and requires costly skilled technicians to program and maintain the equipment. Second, the mechanics of high density interconnect substrates are such that very fine control of the probes, or nails is required in three axes: X, Y and Z. Due to the dimensions of the pads and surface of the DONL structure, small errors in the Z axis (vertical axis) from improper probe planarization or nail pressure can cause severe physical damage to the substrate. Third, this test method requires time to complete. Each substrate must be mounted to a test fixture, subjected to the test and the results noted. This time is costly in terms of manufacturing efficiency resulting in a more costly end product.

Accordingly, more accurate and less time consuming test methods are desirable for thin film DONL fabrication processes.

SUMMARY OF THE INVENTION

The present invention provides a solution to the open circuit test problem. The invention enables an intermediate process step that indicates the presence of open circuits in a rapid, non-tactile manner. The present invention is capable of providing a visual indication of an open connection. Thus, the present invention improves the economy of manufacturing by detecting open circuits with a relatively simple visual inspection technique before a substrate undergoes further contact testing or other testing procedures. Only substrates that pass the visual inspection proceed to subsequent test procedures.

The method of the present invention implements a design rule that requires every contact pad on the bottom surface of the substrate to be electrically connected to a contact pad on the top surface of the substrate. A plating step applies an electrical current to a seed layer deposited over the upper surface of the substrate. The current passes through the seed layer and through each of the plated through holes on the bottom of the underlying printed wiring board substrate to the contact pads on the bottom substrate surface. Thus, when metal plating occurs, only those contacts on the bottom surface of the substrate which have continuity with the seed layer and therefore a contact pad on the upper substrate surface, will be plated. A visual inspection of the substrate's bottom surface quickly reveals any contacts that have not been plated indicating the presence of an open circuit.

In one embodiment of the method of the present invention an improved method for testing for open circuits on a common circuit base having pads for making electrical contact to the common circuit base on both the top and bottom of the circuit base is disclosed. The common circuit base includes a thin film metal interconnect structure formed on its upper surface and the thin film interconnect structure including an upper dielectric layer deposited over a thin film metalization layer that has contact openings etched through the dielectric layer at selected locations for the formation of contact pads. The method includes the steps of (1) forming a seed layer over the upper dielectric layer and over the contact openings; (2) forming a photoresist layer over the seed layer and patterning the photoresist layer to expose selected portions of the seed layer such that the selected portions correspond generally to the contact openings; (3) plating a conductive layer over the patterned seed layer to form plated contact pads that are electrically connected to an underlying thin film metalization layer; and (4) inspecting the plated conductive layer for open circuits prior to performing subsequent process steps and/or tests. In other embodiments, such subsequent process steps and/or tests include: stripping the photoresist; removing the exposed seed layer; forming a passivation dielectric layer and/or performing an electrical test on the common circuit base to determine if any short circuits exist in the interconnect structure. In one preferred embodiment, the subsequently performed electrical test tests only for short circuits and not for open circuits.

According to one embodiment of the structure according to the present invention, a structure is provided in which every plated through hole is electrically connected to an active input/output connection pad that is eventually formed over the top surface (thin film interconnect structure) of the substrate. During the final plating process of the substrate in which the input/output connection pads are formed, gold or a similar conductive material is plated on a copper seed layer on the upper surface of the substrate and copper through holes on the lower surface. The plating occurs only on those connections that have electrical continuity from the bottom surface to the top surface of the substrate. Thus, any open circuit will be readily detectable in a visual inspection.

Specific embodiments of the present invention, as well as its advantages and features, are described in more detail in conjunction with the text below and attached figures.

DETAILED DESCRIPTION OF PREFERRED EMBODIMENTS

Figure 1A:
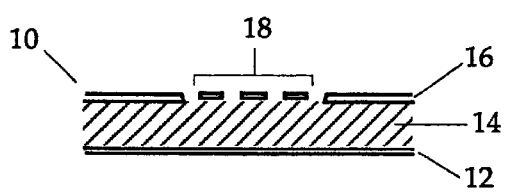
FIG. 1A shows a cross section of single layer printed wiring board substrate.

FIG. 1A is a simplified cross-sectional view of a high density laminated printed wiring board substrate 10. The laminated substrate is formed from a single layer of insulating material 14 such as NEMA FR4 or Mitsubishi BT epoxy resin and has copper sheets 12 and 16 laminates to its upper and lower surfaces, respectively. A desired conductor pattern 18 is transferred to the copper, for example, by photolithography, then placed in a wet chemical etch to remove the unwanted copper, leaving the desired circuit pattern. Several of these sub-laminates with the circuit patterns can be laminated together to form a four layer printed wiring substrate as shown in FIG. 1B.

Figure 1B:
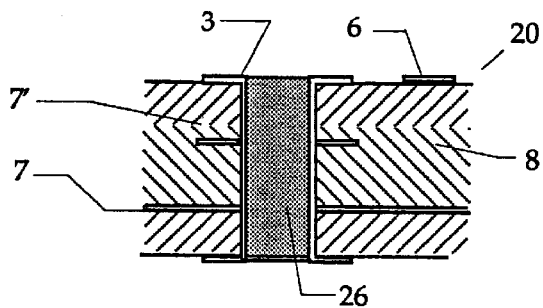
FIG. 1B shows a cross section of conventional four layer printed wiring board substrate with a plated through hole.

FIG. 1B is a simplified cross-sectional view of a four layer printed wiring board substrate 20 which can make use of the present invention. Substrate 20 includes two sub-laminate structures similar to that shown in FIG. 1A. An additional insulative epoxy layer 8 separates the sub-laminates. Internal conductive layers 7 and 7' are used for power and ground planes and to provide stiffness. Plated through holes 3 form connections between the conductive layers on the upper and lower surfaces of the substrate 20 and the internal layers 7 and 7'.

Figure 2:
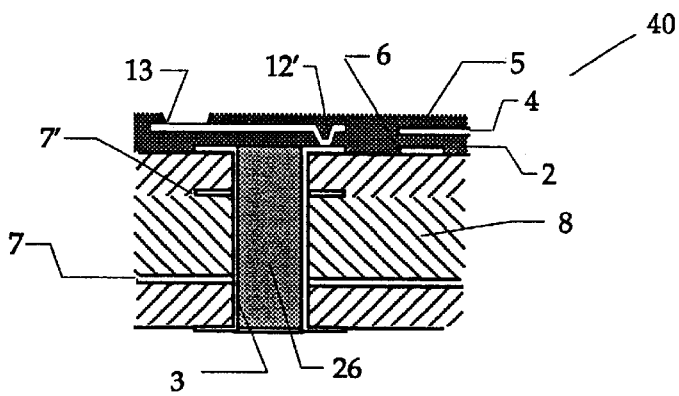
FIG. 2 shows a cross section of a conventional printed wiring board substrate with a single metalized thin film layer.

Shown in FIG. 2 is a typical high density interconnect structure 40 formed using MCM-D technology over a four layer printed wiring substrate 40 similar to substrate 20 in FIG. 1B. The high density interconnect structure includes a dielectric planarization layer 2, a single thin film metalization layer (e.g., copper conductor with a chrome tie layer) 4, and a thin film dielectric passivation layer 5. It is important to note that the thickness of the various layers shown in FIG. 2 are not drawn to scale. In a typical, exemplary application, metalization layers 7 and 7' are about 35 microns thick and metalization layer 6 is about 25 microns thick. In contrast, and in the same exemplary application, the planarization dielectric layer 2 is 45 to 50 microns thick, the thin film deposited metalization layer 4 is about 5.0 microns thick, and the thin film deposited passivation layer 5 is 10 to 12 microns thick.

Metalization layer 4 is the only thin film conductive layer deposited over substrate 40 in the embodiment of the present invention shown in FIG. 2. In other embodiments of the invention, two or more separate metalization layers 4 may be deposited over substrate 40 and separated by separate dielectric layers 5. Interconnects, or vias, 12' are formed between layers 6 and 4 by photo expose and develop cycles, laser ablation or plasma etch methods depending on the type of dielectric material used. Contact pads 13 formed on the upper surface of substrate 40 provide the high density solder connection pads for an integrated circuit device that can be electrically connected to substrate 40 by, for example, wire bonding or flip chip techniques as understood by a person of ordinary skill in the art. Contact/solder pads (not shown) that are electrically connected to plated through holes 3, which may or may not be capped, provide the low density solder connection pads that interface to the outside world on the lower surface of the four layer printed wiring substrate 40. Plated through holes 3 are filled with a material 26 (e.g., an insulative or conductive epoxy) that is planarized to allow thin film formation on the top surface of the through hole.

One of the last steps in the fabrication of a high density deposited thin film interconnect substrate is the deposition of gold or a similar conductive material to form the contact pads on both the top and bottom surfaces of the substrate. The present invention provides a novel and improved method of forming this conductive layer that allows a visual inspection of the substrate, after the layer is formed through a plating process, to determine if any open circuits exist on the substrate.

According to the method of the present invention, a design rule is implemented in which every pad on the bottom surface of the substrate that is associated with a plated through hole appearing on the bottom surface of the substrate must connect, electrically, to an active input/output connection pad on the top surface of the high density interconnect structure. Certain internal nets, or circuits, may not connect to an active input/output pad, thus the design rule does not require these circuits to be connected to a plated through hole. This design rule can be implemented by circuit designers with the help of a computer program design rule check program such as Dracula™ as would be understood by a person of ordinary skill in the art. Plating is then done by first laying down a seed material over the entire top surface of the substrate and immersing the substrate into a plating bath. The seed material acts as one electrode for the plating current. During the plating process, current passes from the common bath electrode to the seed layer electrode. Where continuity exists from the bottom of the substrate through the plated through holes to the top surface input/output pad connections, a thin plating of gold (or other material being plated) is deposited. Where there is a break in continuity, whether it be from a poorly plated through hole or a break in a thin film layer via, no plating will take place.

Figure 3:
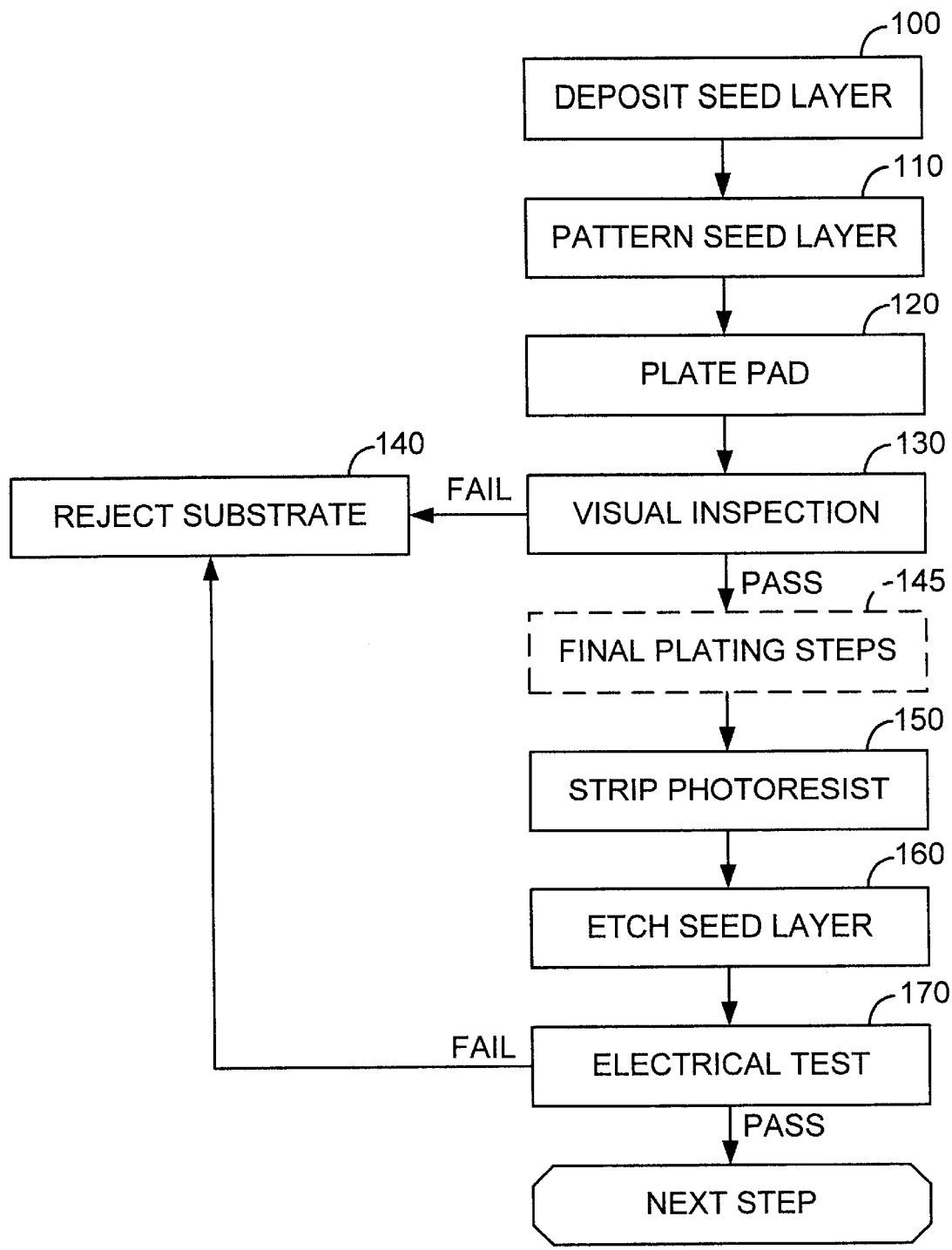
FIG. 3 is a flow chart of the method of the present invention.
Figure 4A:
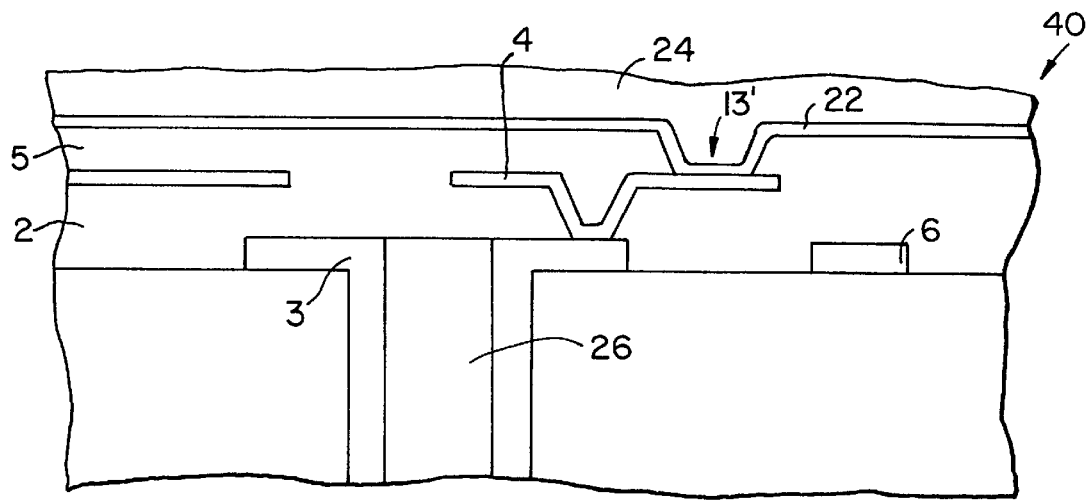
FIGS. 4A–4D are simplified cross-sectional views of an upper surface of the substrate shown in FIG. 2 as it undergoes the various steps set forth in the flow chart of FIG. 3.

One embodiment of the method of the present invention is described below in conjunction with FIGS. 3 and 4A–4D. In this embodiment, the upper layer of metalization is used only for the formation of contact pads 13 and not for the use of additional signal interconnect lines. FIG. 3 is a flow chart illustrating the steps of this embodiment, while FIGS. 4A–4D show a substrate, such as four-layer printed wiring board substrate 40 of FIG. 2, as it undergoes the various processing steps set forth in FIG. 3. As shown in FIG. 4A, the first step of the method of the present invention (step 100, FIG. 3) is to deposit a seed layer 22 over the upper surface of substrate 40. Seed layer 22 is blanket deposited over the entire upper surface of substrate 40 including contact pad areas 13' that have been etched through dielectric layer 5 prior to the formation of the contact pad itself. Seed layer 22 can be deposited by a number of different methods as would be known to a person of ordinary skill in the art. In one preferred embodiment seed layer 22 is a chrome/copper stack where the chrome layer is an adhesive layer approximately 200 Å thick and the overlying copper layer is approximately 2000 Å thick with each layer being deposited by a sputtering process.

Figure 4B:
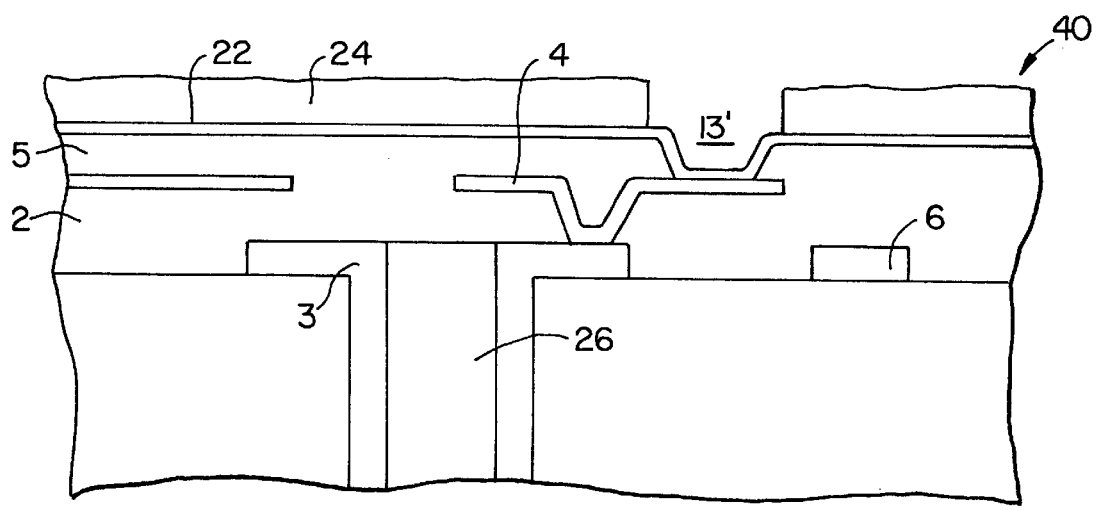

Next, seed layer 22 is patterned (FIG. 3, step 110) by depositing a photoresist layer 24 over seed layer 22, exposing selected portions of layer 24 to UV light and developing the unexposed layer to remove portions of the photoresist in and around areas 13'. FIG. 4B shows a portion of substrate 40 after is has undergone patterning step 110.

At this stage, substrate 40 is ready for the plating process (FIG. 3, step 120). In the plating process, substrate 40 is immersed in a plating bath (e.g., in a SFT plating tool manufactured by Technics Corporation) and electrical contact is made to seed layer 22 so that the seed layer acts as a cathode. Preferably, electrical contact is made to an exposed area of the seed layer on the periphery (i.e., outside the active area) of the substrate.

Figure 4C:
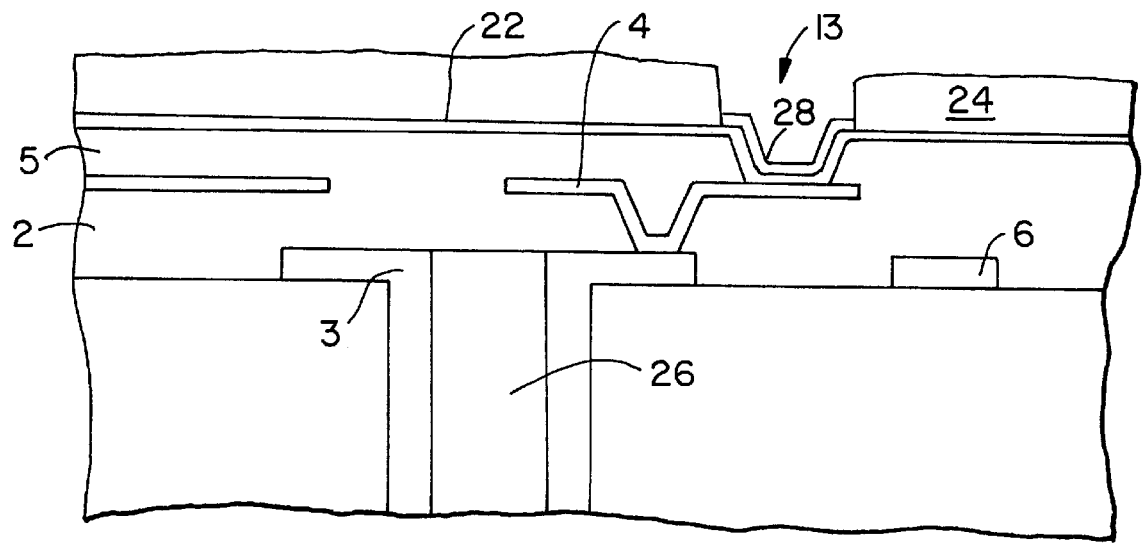

In the plating bath, substrate 40 is positioned between two opposing anodes so that material can be plated on both the upper and lower surfaces of the substrate. FIG. 4C shows the resulting plated layer 28 (contact pad 13) formed on the upper surface of substrate 40. All exposed pads on both the top and bottom surfaces of the substrate are plated. The exposed pads on the top surface include connection pads 13, while the exposed pads on the bottom surface (not shown in FIG. 4C) are electrically connected on the bottom of the substrate to the plated through holes. Because the method of the present invention utilizes a design rule in which all plated through holes are electrically connected to a contact pad 13, plating should occur on the bottom pads connected to each plated through hole unless a defect (open) exists in the substrate.

Figure 5A:
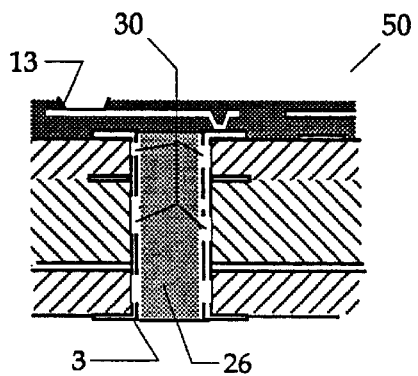
FIGS. 5A and 5B show cross sections of a conventional printed wiring board substrate with a single metalized thin film layer exhibiting an open plated through hole and an open via, respectively.

FIG. 5A shows a substrate 50 having an incompletely plated through hole 3. Note that even though the thin film interconnect layer has been properly fabricated, no continuity exists in this connection. As a result, the solder pads on the bottom of the substrate that are electrically connected to plated through hole 3 will not become plated with the metal suspended in the plating bath during the plating operation because the plated through hole 3 has several gaps 30 caused by incomplete plating of the barrels of the hole.

Figure 5B:
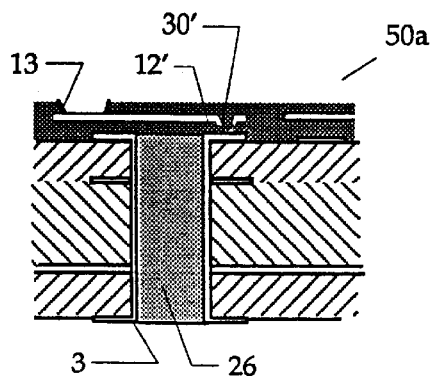

FIG. 5B shows a substrate 50a having an open in an internal via. In this situation substrate 50a, with its internal via 12' which connects the top of the printed wiring substrate to the build-up metalization layer, is not properly plated. Gaps 30' indicate that a discontinuity in the via plating is present. The final result after a plating step will be the same as that for the open in the plated through hole. Plating current will not be able to pass from the seed material through plated through hole 3.

The plating step is such that prior to completion the exposed pads have a copper color since the metalization of the layers is formed from copper metallurgy. The plating solution contains a different metal, for example, gold. Thus, after plating step 120 is complete, a visual inspection (step 130) is performed to determine if the substrate includes any opens. Alternatively, an automated machine-implemented, optical or other type of test can be used to determine if the substrate includes opens. Where continuity exists from the bottom of the substrate to the top of the substrate the color of the pads will now be gold. Where continuity does not exist, the color will remain copper. If opens are found, the substrate is rejected (step 140) and will not be subject to further electrical testing in step 170. Typically, the substrates are part of a larger parcel. Thus in such a case, the rejected substrates will proceed through the subsequent thin film formation steps along with the non-rejected substrates. The results of application of the present invention is a rejection of substrates containing open circuits prior to investing further downstream testing resources. A savings of both time and cost is thus realized.

Figure 4D:
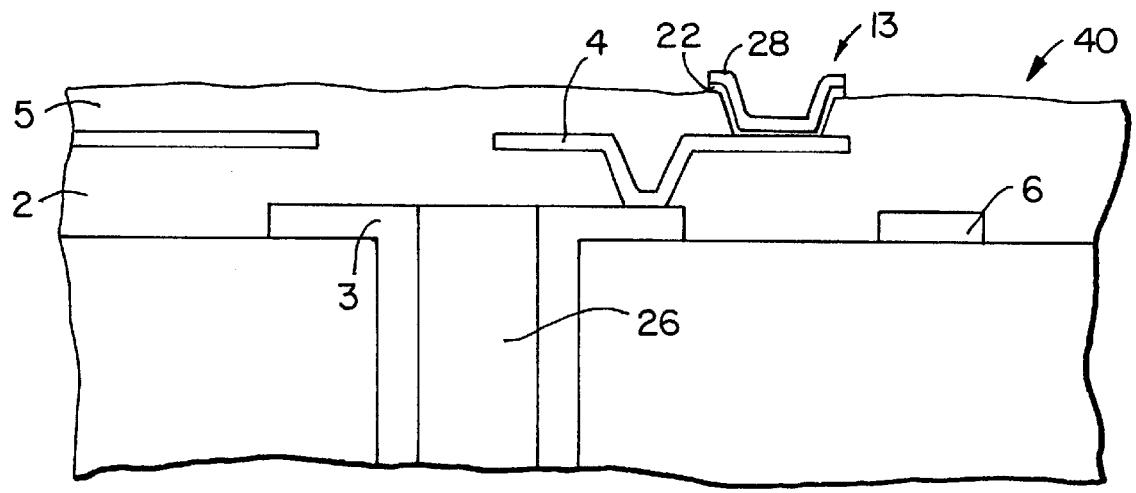

After the visual inspection test, photoresist layer 24 is stripped (step 150) and the exposed portion of seed layer 22 are etched away (step 160). FIG. 4D shows the resulting substrate. In a preferred embodiment, a positive patterning process is used in which the photoresist material is AZ 4620 supplied by Hoechst Corporation, the resist is stripped by a solution of n-methyl pyrrollidone in an appropriate solvent and the seed layer is etched with a sodium persulfate compound. Of course, persons of ordinary skill in the art will recognize that other resist solutions may be used in other embodiments of the invention.

In a preferred embodiment, three separate plating steps are used rather than a single step 120. A first plating step immerses the substrate in a plating bath containing copper and the second plating step immerses the substrate in a plating path containing dissolved nickel. The plating steps form a 3.0 to 5.0 micron thick layer of copper and a 1.0–3.0 micron thick layer of nickel on both the upper contact pad area (pad 13) and the contact pad on the bottom of the substrate (not shown) that is electrically connected to plated through hole 3. In the third and final plating step, the substrate is immersed in a bath containing dissolved gold. When the plating current is passed through the plated through hole 3, a 0.25–2.0 micron thick layer of gold is plated on top of the nickel on both the upper contact pad 13 and the bottom pad. In this embodiment, the first two plating steps are performed as step 120 and the third plating step can be performed as step 145, after inspection step 130. Alternatively, all plating steps can be performed prior to visual inspection step 130.

Figure 6A:
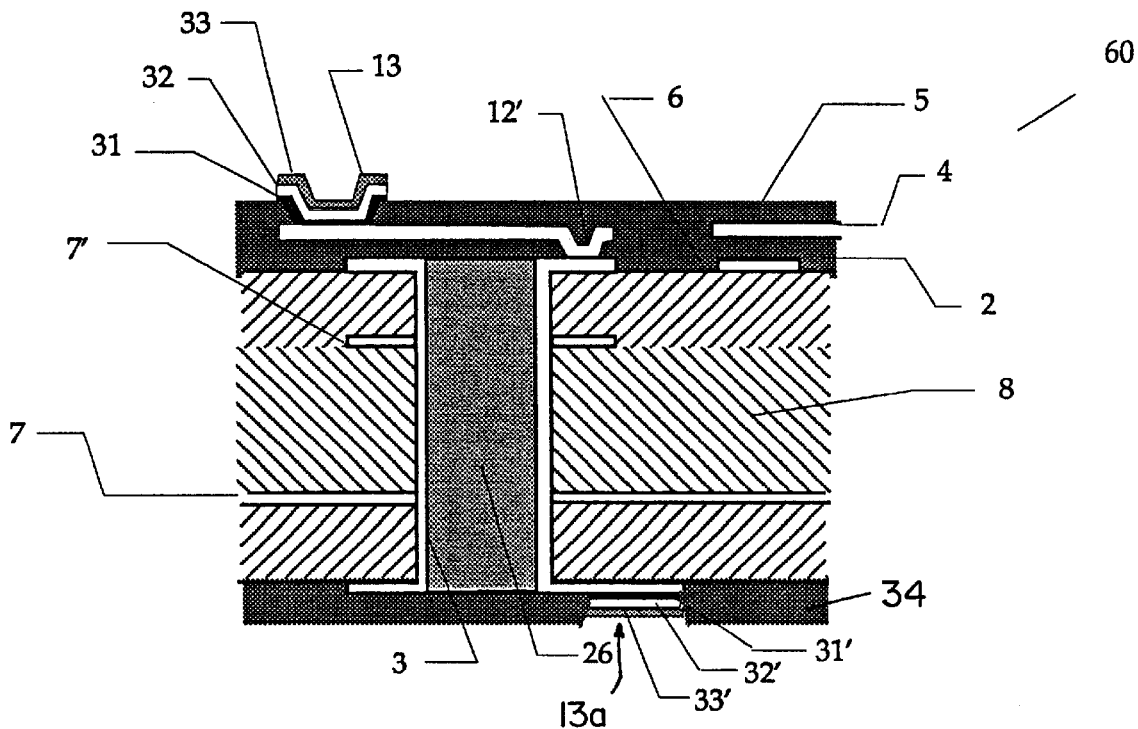
FIGS. 6A, 6B and 6C show the results of the final gold plating operation on both a good and bad connections.

FIG. 6A shows the results of a properly plated through hole according to the present invention. Substrate 60 has a plated through hole 3 that has been completely plated, and an internal via 12' which is likewise properly plated. As a result, continuity exists from the bottom of the substrate 60 to the top of the build-up layer. When immersed in the plating bath, current flows from the seed material lining input/output solder pad 13 on the upper surface of the substrate to the contact/solder pad 13a on the bottom of the substrate associated with plated through hole 3. An opening etched through a solder mask 34 exposes contact/solder pad 13a to the plating bath. Input/output pad 13 has a layer of copper 31, a layer of nickel 32 and a layer of gold 33. Similarly, the pad on the bottom of the substrate associated with plated through hole 3 has copper layer 31', nickel layer 32' and a layer of gold 33'.

Figure 6B:
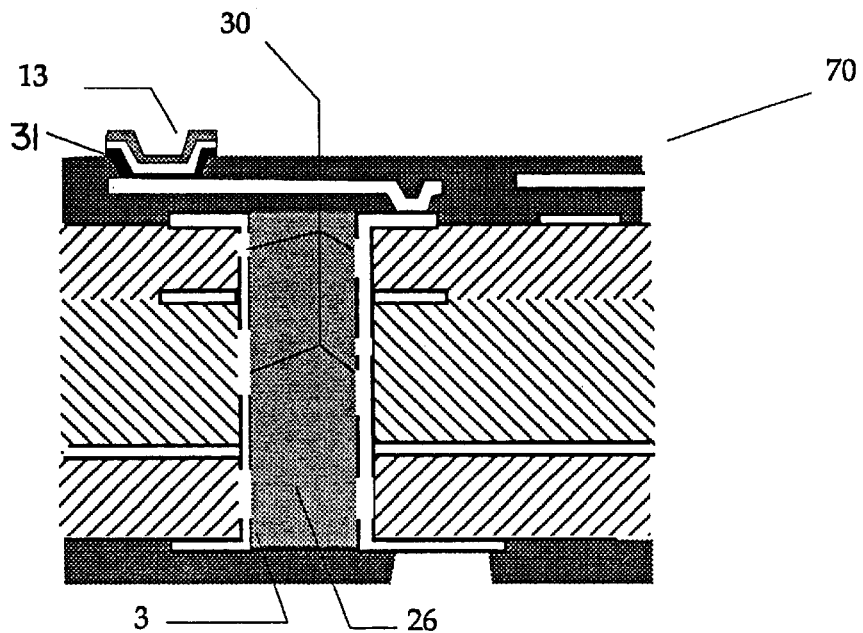
Figure 6C:
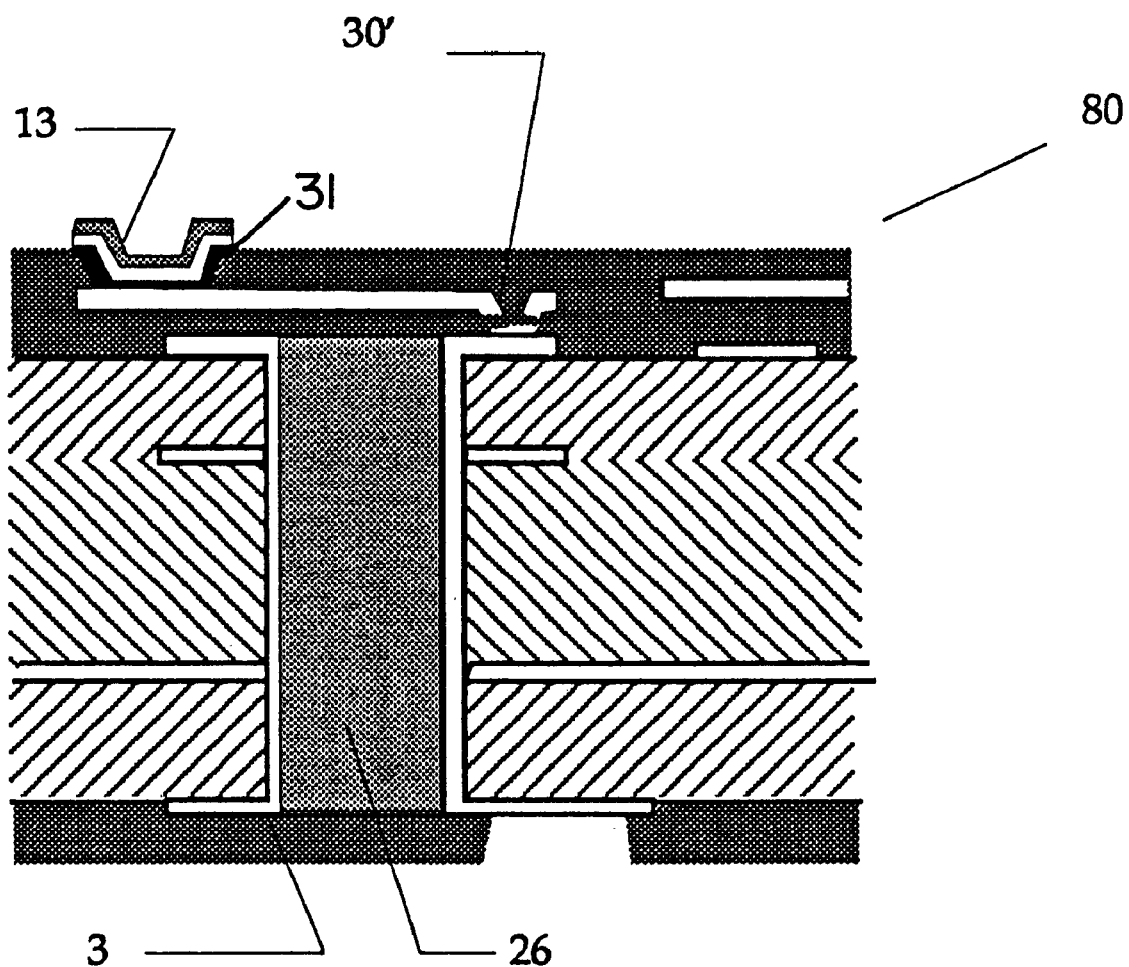

FIG. 6B shows a substrate 70, similar to the substrate of FIG. 5A. An incompletely plated barrel in plated through hole 3 has numerous opens 30. As a result plating does not occur on the bottom pad. Similarly, a substrate 80 of FIG. 6C does not have plating over the bottom pad. Here, however, the open is in the internal via 12'. In both cases the input/output solder pad 13 will be plated because electric contact is made directly to the seed layer while the substrate is in the plating bath. Pad 13' on the bottom of the substrate is not plated, however, because of the lack of electrical continuity from seed layer 31 to pad 13'.

Once the substrate 60 of FIG. 6A has been completed it is ready to be tested for correct metal patterns (step 170). These patterns represent the circuits, or nets, between devices which will later be mounted on the substrate. As was discussed in the Background of the Invention section above, one conventional method of testing requires making physical contact with each net and applying a current to determine if continuity exists. If it does, the next net is tested. This process is followed for each net until the substrate pattern is completely verified. On large area panels such as those used in the present invention each of the individual substrates on the panel must be individually tested. In actual operation the testing is automated through testing equipment, usually under the control of a computer.

In another embodiment of the present invention, the top metalization layer [seed layer and plated layer(s)] functions as both a pad layer and a distribution signal interconnect layer. The sequence for forming the pad layer/signal interconnect layer is similar to the sequence set forth above with respect to FIGS. 3 and 4A–4D except that (1) patterning step 110 is used to expose and remove the photoresist in area where pads 13 are formed and in other selected areas where signal distribution lines are to be formed; and (2) after step 160 but before electrical test step 170 a passivation dielectric layer is formed over the substrate and patterned to expose the contact pads.

While the intermediate test of step 130 according to the present invention can accurately detect opens, it cannot detect shorts. Thus, if an active input/output connection pad is connected to an open plated through hole but is also shorted to some other net, the test will not indicate the short. The result is that the open indication may appear to the operator, but only a complete electrical test would indicate the short. Thus, a final electrical test (step 170), must be performed to confirm that no shorts exist.

As was previously mentioned, the present invention uses a design rule that requires all contact pads 13a on the bottom surface of the substrate to be electrically connected to a contact pad on the upper substrate surface. Depending on the layout of nets on the upper substrate surface this design rule, by itself, does not allow the visual inspection test to guarantee that no opens at all exist on the entire interconnect structure. Instead, it allows a visual inspection to determine whether opens exist between pads on the upper surface and pads on the bottom surface. In single-chip applications, this design rule may allow the visual inspection to determine if no opens exist anywhere on the substrate providing that every contact pad on the upper surface is electrically coupled to a pad on the lower surface. This will be true for many single chip applications but may not be true if, for example, a component such as a resistor or capacitor is to be soldered to a net having an upper contact pad not electrically connected to one of the plated through holes.

If every contact pad on the upper surface of the substrate is also connected to a plated through hole (this requirement could further be added to the design rule in many single-chip applications), the electrical test in step 170 can be designed to check for only shorts and not for opens. Alternatively, even if this additional requirement is not met, test engineers/ circuit designers may decide, based on a statistical analysis, that the number of pads on the upper surface not connected to plated through holes is insufficient to justify the added cost of an opens test in step 170 in addition to a shorts test.

In other embodiments, where the invention is employed in a multichip package, it is common to have a number of nets on the upper surface of the substrate that connect pins from one chip to those of another without interfacing to the outside world through contact pads 13a on the substrate's bottom surface. In these embodiments it cannot be conclusively determined that no opens exist in such nets. That is, test 130 cannot detect opens in nets that connect one high density interconnect pad 13 on the upper surface of the substrate to another high density interconnect pad without connecting to a plated through hole. In these embodiments, electrical test 170 should include both opens and shorts tests unless test engineers consciously decide through statistical or other analyses that the opens test is unnecessary for given design. In any event, an advantage of either embodiment of the invention is that if an open is indicated in test 130 there is no need to subject the flawed substrate to further testing.

There are several advantages to these embodiments of the present invention. One benefit of this invention is the ability to determine good substrates after exiting from the gold plating bath and prior to further processing. This is a benefit since it allows early identification of both bad individual substrates and potential process degradation. While it is not possible to extract a single substrate from a larger panel in the middle of the process, this early notice can save both time and cost by allowing for process correction in a timely manner.

A second benefit of the structure and method disclosed in this specification is that it is non-tactile. Having the ability to detect faults without physical contact with the pads on the surface of the substrate eliminates impact and/or scrapping damage from nails or probes.

A third benefit is that it is fast. There is no need to set up the test equipment, load the substrates into a test fixture, run the test program, analyze the results, then take appropriate action. The operator simply inspects the results of the plate up process. The open circuits are obvious since they are copper colored on the bottom of the substrate.

A fourth benefit of the invention is that is economical. The combination of time, space, equipment and specialized personnel cost savings makes this method superior to conventional testing practices by significantly reducing test costs.

A fifth benefit is the use of front side seed to plate the back side, thus eliminating the need for a separate plating process for the back side.

In one specific embodiment, metalization layers 14a, 14b, 16a, and 16b of the four-layer PWB substrate are formed from copper foil laminated to the top and bottom surfaces of sub-laminates 12a and 12b. Layers 14a and 14b are about 25 microns thick, while layers 16a and 16b are slightly thicker, about 35 microns. Sub-laminates 12a and 12b, as well as layer 22 are made from Mitsubishi BT HL810 resin dielectric.

In this embodiment, the thin film planarization layer is Nippon Steel Chemical V-259PA dielectric coated to a thickness of 40 to 50 microns. Metalization layer 30 is a chrome/copper stack deposited from, for example, a sputtering process as known to those skilled in the art. Alternatively, layer 30 can be other copper metallurgy (e.g. chrome/copper/chrome or copper/palladium among others) and can be deposited from a plating process as would also be known to those of skill in the art. The passivation layer in this embodiment is a thin film dielectric layer of Nippon Steel Chemical V-259PA, a photo definable cardo acrylate material, and is deposited to a thickness of about 10–12 microns by processes known to those of ordinary skill in the art.

While the details of the present invention are illustrated with respect to a printed wiring board substrate it is to be understood that the present invention can be used to determine whether open circuits exist in thin film metalization interconnect structures deposited over any two-sided common circuit base. As used in this application, a two-sided common circuit base is any substrate, daughter board or multichip module upon which chip-level and/or component-level interconnects are formed and upon which electrical contact to the circuit base is made on both the upper and lower surfaces of the base. Examples of two-sided common circuit bases include printed wiring board substrates and ceramic substrates among others. An integrated circuit die, itself, is neither common circuit base or a two-sided common circuit base. Instead, the bonding pads of the die would typically be connected by a first level interconnection scheme (e.g., wire bonding, tape automated bonding, flip chip bonding, etc.) to a two-sided common circuit base that includes power and ground conductors and signal interconnection lines to connect the die to other die and/or support components such as capacitors and resistors. The method of the present invention is useful to test for open circuits in those signal interconnection lines.

Having fully described several embodiments of the present invention., many other equivalent or alternative embodiments will be apparent to those of ordinary skill in the art. For example, prior to the plating step a seed layer similar to layer 22 could be deposited on the bottom of the substrate rather than on the upper surface. During the plating process, then, electrical contact is made to this seed layer on the bottom surface of the substrate. In this embodiment, the subsequent patterning, stripping and etching steps would then be performed on this bottom surface also. These embodiments are intended to be covered by the scope of the present invention and the only limiting factor of this invention are the claims set forth below.

What is claimed is:

1. A method for testing for open circuits on et two-sided common circuit base, said method comprising:
   (a) providing a two-sided common circuit base having (i) upper and lower major surfaces, (ii) a plurality of plated ugh holes traversing through said common circuit base, said plated through holes having an exposed contact surface on said lower major surface, and (iii) a thin film metal interconnect structure formed over said upper major surface, said thin film interconnect structure including an upper dielectric layer deposited over a thin film metalization layer and having contact openings etched through said dielectric layer at selected locations, (iv) wherein every exposed contact surface on said lower major surface is electrically connected to metalization in at least one of said contact openings;
   (b) forming a seed layer over said upper dielectric layer and over said contact openings;
   (c) forming a photoresist layer over said seed layer and patterning said photoresist layer to expose selected portions of said seed layer, wherein said selected portions correspond generally to said contact openings and define locations at which upper contact pads are formed on said common circuit base;
   (d) performing a plating operation to simultaneously plate first and second conductive layers over said common circuit base, wherein said first conductive layer is plated over exposed portions of said seed layer in areas where upper contact pads are formed and said second conductive layer is plated over said exposed contact surfaces on said lower major surface in areas where lower contact pads are formed; and
   (e) inspecting the bottom of said common circuit base for open circuits.

2. The method of claim 1 further comprising:
   (f) after step (e), stripping said photoresist in areas where said plated contact pads do not exist to expose said seed layer underlying said photoresist;
   (g) removing said exposed seed layer.

3. The method of claim 1 wherein every exposed contact opening on the top surface of the common circuit base is electrically connected to a plated through hole on the bottom surface of the common circuit base.

4. The method of claim 1 wherein said common circuit base is a printed wiring board substrate.

5. The method of claim 1 wherein said plating is performed by submersing said common circuit base in a plating solution and applying a plating current to said seed layer.

6. The method of claim 5 wherein said plating is performed by directly coupling an electrode to said seed layer, wherein said electrode supplies said plating current to said seed layer.

7. The method of claim 1 further comprising, after step (d), plating a second conductive layer over said first conductive layer.

8. The method of claim 1 further comprising, after step (e), performing an electrical test on said common circuit base to determine if any short circuits exist in said interconnect structure.

9. The method of claim 1 wherein said inspecting operation is a visual inspection performed by a human.

10. The method of claim 1 wherein said inspecting operation is an automated process performed by a machine.

11. The method of claim 1 whereby (i) for all contact openings on the upper surface where continuity exists between the upper surface and the lower surface, a thin layer of metal will be plated on the exposed metalization of both the upper and lower surfaces and (ii) for all contact openings on the upper surface where continuity does not exist, a metal plating layer will be absent from the exposed metalization of the bottom surface.

12. The method of claim 11 wherein said inspecting operation includes inspecting the bottom surface of the plated common circuit board to determine whether the exposed metalization on said bottom has a color consistent with a plated conductive metal or has a color consistent with a base metal.

13. The method of claim 12 wherein said base metal comprises copper and said plated conductive metal comprises gold and wherein said inspecting operation includes inspecting the bottom surface of the plated common circuit board to determine whether the exposed metalization on said bottom has a copper or gold color.

14. The method of claim 12 wherein said base metal comprises copper and said plated conductive metal comprises solder and wherein said inspecting operation includes inspecting the bottom surface of the plated common circuit board to determine whether the exposed metalization on said bottom has a copper or solder color.

15. The method of claim 1 wherein plating occurs only in the areas of said contact opening on the top of said common circuit base and plating does not occur outside the areas of said contact openings on the top of said common circuit base, and wherein plating occurs only in the areas of said exposed contact surface on the bottom of said common circuit base and plating does not occur outside the areas of said exposed contact surface on the bottom of said common circuit base.

16. The method of claim 1 wherein said plating operation makes electrical contact only to said seed layer and places said two-sided circuit base in a plating bath.

17. A two-sided common circuit base upon which one or more integrated circuits are to be electrically connected to a second integrated circuit and/or to support components, said two-sided common circuit base having upper and lower major surfaces and comprising:
  a first patterned conductive layer including a plurality of conductive lines having edges that define boundaries of said conductive lines formed on said upper major surface of said common circuit base;
  a planarizing dielectric layer formed over said first patterned conductive layer and between the edges of said conductive lines;
  a thin film interconnect structure formed over said first planarized dielectric layer, said thin film interconnect structure including a thin film metalization layer and a thin film dielectric layer;
  a plurality of plated through holes traversing through said common circuit base such that each of said plated through holes has an exposed contact surface on said lower major surface of said common circuit base and has a portion extending over a part of the upper major surface of said common circuit base;
  wherein every one of said plurality of through holes is electrically connected to a contact pad formed on top of said thin film dielectric layer.

18. A method for forming a common circuit base having a plurality of plated through holes and having high density contact pads on an upper surface of the circuit base for making electrical contact between said common circuit base and at least one integrated circuit and having low density contact pads on a lower surface of the common circuit base, said method comprising:
  (a) during the formation of said common circuit base, implementing a design rule that each of said low density contact pads that is associated with one of said plated through holes is electrically connected to at least one of said high density contact pads on said upper surface;
  (b) forming a metal seed layer over either said upper surface or said lower surfaces of said common circuit base;
  (c) forming a photoresist layer over said seed layer and patterning said photoresist layer to expose selected portions of said seed layer;
  (d) immersing said substrate in a plating bath and positioning said substrate between two opposing electrodes; and
  (e) plating a conductive layer over said exposed portions of said seed layer on said upper surface and said low density contact pads, or plating a conductive layer over said exposed portions of said seed layer on said lower surface and said high density contact pads, of said common circuit base to form plated contact pads, wherein said plating step is performed by making electrical contact to said seed layer while said substrate is in a plating bath.

19. The method of claim 18 wherein said seed layer is formed over the upper surface of said common circuit base and said patterning step exposes said high density contact pads.

20. The method of claim 19 further comprising:
  (f) visually inspecting said plated conductive layer on said lower surface for open circuits prior to performing electrical tests on said substrate.

21. The method of claim 19 wherein said seed layer is formed over the lower surface of said common circuit base and said patterning step exposes said low density contact pads.

22. The method of claim 21 further comprising:
  (f) visually inspecting said plated conductive layer on said upper surface for open circuits prior to performing electrical tests on said substrate.

23. A method for forming a common circuit base having a plurality of plated through holes and having high density contact pads on an upper surface of the circuit base for making electrical contact between said common circuit base and at least one integrated circuit and having low density contact pads on a lower surface of the common circuit base, said method comprising;
  (a) during the formation of said common circuit base, implementing a design rule that each of said low density contact pads that is associated with one of said plated through holes is electrically connected to at least one of said high density contact pads on said upper surface;

(b) forming a metal seed layer over either said upper surface or said lower surfaces of said common circuit base;

(c) forming a photoresist layer over said seed layer and patterning said photoresist layer to expose selected portions of said seed layer;

(d) immersing said substrate in a plating bath and positioning said substrate between two opposing electrodes; and (e) plating a conductive layer over said exposed portions of said seed layer on said upper surface and said low density contact pads, or plating a conductive layer over said exposed portions of said seed layer on said lower surface and said high density contact pads, of said common circuit base to form plated contact pads, wherein said plating step is performed by making electrical contact to said seed layer while said substrate is in a plating bath, and wherein the entire said upper and lower surface of said common circuit base are not electroplated.

24. The method of claim 23 wherein said seed layer is formed over the upper surface of said common circuit base and said patterning stop exposes said high density contact pads.

25. The method of claim 24 further comprising:

(f) visually inspecting said plated conductive layer on said lower surface for open circuits prior to performing electrical tests on said substrate.

26. The method of claim 24 wherein said seed layer is formed over the lower surface of said common circuit base and said patterning step exposes said low density contact pads.

27. The method of claim 26 further comprising:

(f) visually inspecting said plated conductive layer on said upper surface for open circuits prior to performing electrical tests on said substrate.

* * * * *